(12) United States Patent
Dabral et al.

(10) Patent No.: US 7,525,723 B2
(45) Date of Patent: Apr. 28, 2009

(54) CIRCUIT BOARD-TO-CIRCUIT BOARD CONNECTORS HAVING ELECTRO-OPTIC MODULATORS

(75) Inventors: Sanjay Dabral, Palo Alto, CA (US); Mohiuddin Mazumder, San Jose, CA (US); Hai-Feng Liu, Cupertino, CA (US); Larry Tate, Hopkinton, MA (US)

(73) Assignee: Intel Corporation, Santa Clara, CA (US)

( * ) Notice: Subject to any disclaimer, the term of this patent is extended or adjusted under 35 U.S.C. 154(b) by 280 days.

(21) Appl. No.: 11/479,889

(22) Filed: Jun. 30, 2006

(65) Prior Publication Data
US 2008/0003842 A1   Jan. 3, 2008

(51) Int. Cl.
*G02F 1/29* (2006.01)
*G02B 6/26* (2006.01)

(52) U.S. Cl. .......................................... 359/315; 385/40

(58) Field of Classification Search .................. 359/315, 359/245, 247, 290, 302, 251–252, 254; 385/1–3, 385/40, 129–132
See application file for complete search history.

(56) References Cited

U.S. PATENT DOCUMENTS

| | | | |
|---|---|---|---|
| 5,303,079 | A | 4/1994 | Gnauck et al. |
| 6,004,044 | A | 12/1999 | Paulus et al. |
| 6,571,359 | B1 | 5/2003 | Padwekar et al. |
| 6,590,691 | B1 * | 7/2003 | Nagra et al. ............ 359/237 |
| 6,601,196 | B1 | 7/2003 | Dabral et al. |
| 6,624,922 | B1 | 9/2003 | Palese |
| 6,690,845 | B1 | 2/2004 | Yoshimura et al. |
| 6,697,957 | B1 | 2/2004 | Wang et al. |
| 6,704,277 | B1 | 3/2004 | Dabral et al. |
| 6,925,584 | B2 | 8/2005 | Padwekar et al. |
| 6,999,664 | B2 | 2/2006 | Nicolaescu et al. |
| 7,006,716 | B2 | 2/2006 | Bhowmik |
| 7,006,717 | B2 | 2/2006 | Liu et al. |
| 7,019,907 | B2 | 3/2006 | Verdiell |
| 7,020,363 | B2 | 3/2006 | Johannessen |
| 7,221,813 | B2 | 5/2007 | Yakymyshyn et al. |
| 2003/0228093 | A1 | 12/2003 | Notani |
| 2007/0237527 | A1 | 10/2007 | Dabral et al. |

OTHER PUBLICATIONS

FCI Connect, "AirMax VS Connector System, Backplane connector of choice to meet design requirements to speeds greater than 12.5Gb/s", *Application Datasheet 950535-004*, (Jan. 2005),pp. 1-2.

(Continued)

*Primary Examiner*—Scott J Sugarman
*Assistant Examiner*—Dawayne A Pinkney
(74) *Attorney, Agent, or Firm*—Blakely, Sokoloff, Taylor & Zafman LLP

(57) ABSTRACT

An electrical connector to be electrically disposed between a first circuit board and a second circuit board to electrically couple the first circuit board with the second circuit board is disclosed. The electrical connector may have an electro-optic modulator to modulate optical signals based on electrical signals exchanged between the first and second circuit boards through the electrical connector. Systems incorporating such electrical connectors, and methods of using the electrical connectors and systems, such as for debug, are also disclosed.

23 Claims, 8 Drawing Sheets

OTHER PUBLICATIONS

Howerton, M. M., et al., "Subvolt Broadband Lithium Niobate Modulators", http://www.nrl.navy.mil/content.php?P=02REVIEW177, pp. 3-4.

Intel Corporation, "Silicon Photonics", *Intel Technology Journal, Optical Technologies and Applications*, vol. 8, Issue 2, ISSN 1535-864X,(May 10, 2004),pp. 144-160.

Noge, S. , et al., "Frequency measurement of piezoelectric resonator using laser light", *Dept. of Electr. & Electron. Eng., Kanagawa Inst. of Technol., 2006 IEEE*, (2006),1 page.

THIN-FILM.COM, et al., "AFCI & TFT Present: 10Gb/s with Equalized Connectors", https://portal.fciconnect.com/res/en/pdffiles/TFT%20demo%20handout.pdf, 2 pages.

Tsang, J. C., et al., "Temporal characterization of CMOS circuits by time resolvedemission microscopy", *IBM Thomas J. Watson Res. Center, 2006 IEEE*, (2006),1 page.

TTIINC.COM, "FCI AirMax VS Highspeed Shieldless Connector", www.ttiinc.com/object/FP_FCI_Airmax.html, (Jun. 28, 2006),pp. 1-2.

Yee, Wai Mun , et al., "Laser voltage probe (LVP): a novel optical probing technology forflip-chip packaged microprocessors", *Intel Technol., 2006 IEEE*, (2006),1 page.

"PCT/US2007/072056 International Search Report", (Nov. 15, 2007), 3.

Office Action mailed Dec. 7, 2007 for U.S. Appl. No. 11/479,888, 15 pages.

Response to Office Action filed Feb. 27, 2008 for U.S. Appl. No. 11/479,888, 16 pages.

Office Action mailed Jun. 6, 2008 for U.S. Appl. No. 11/497,888, 17 pages.

\* cited by examiner

CIRCUIT BOARD-TO-CIRCUIT BOARD CONNECTORS HAVING ELECTRO-OPTIC MODULATORS

BACKGROUND

1. Field

Embodiments of the invention pertain to electrical connectors. In particular, embodiments of the invention pertain to circuit board-to-circuit board electrical connectors having electro-optic modulators.

2. Background Information

Microelectronic devices are often debugged or validated by testing prior to their widespread release. The testing commonly includes capturing electrical signals exchanged with the microelectronic device, and analyzing the captured electrical signals using a logic analyzer.

Different approaches for capturing the electrical signals are known in the arts. Several approaches will be discussed briefly in order to illustrate certain concepts and help in understanding the significance of the developments described herein. The approaches discussed below are not intended to be exhaustive.

One approach for capturing the electrical signals uses direct probing in which electrical probes are landed directly on a bus or serial interconnect that carries the electrical signals to and from the microelectronic device. However, potential drawbacks with this direct probing approach include perturbation to signal integrity and/or that significant challenges may be encountered when implementing this approach at speeds of about 5 Gb/s or higher.

Another approach uses copy and repeat in which a specially designed debug chip is placed on the serial link to intercept incoming data from the microelectronic device, send a copy of the data to the logic analyzer, and then forward or repeat the data to a target destination. However, potential drawbacks with this copy and repeat approach include potentially perturbation in latency and/or increased area, power consumption, or cooling resources. The debug chip may also take time and effort to develop and/or change.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
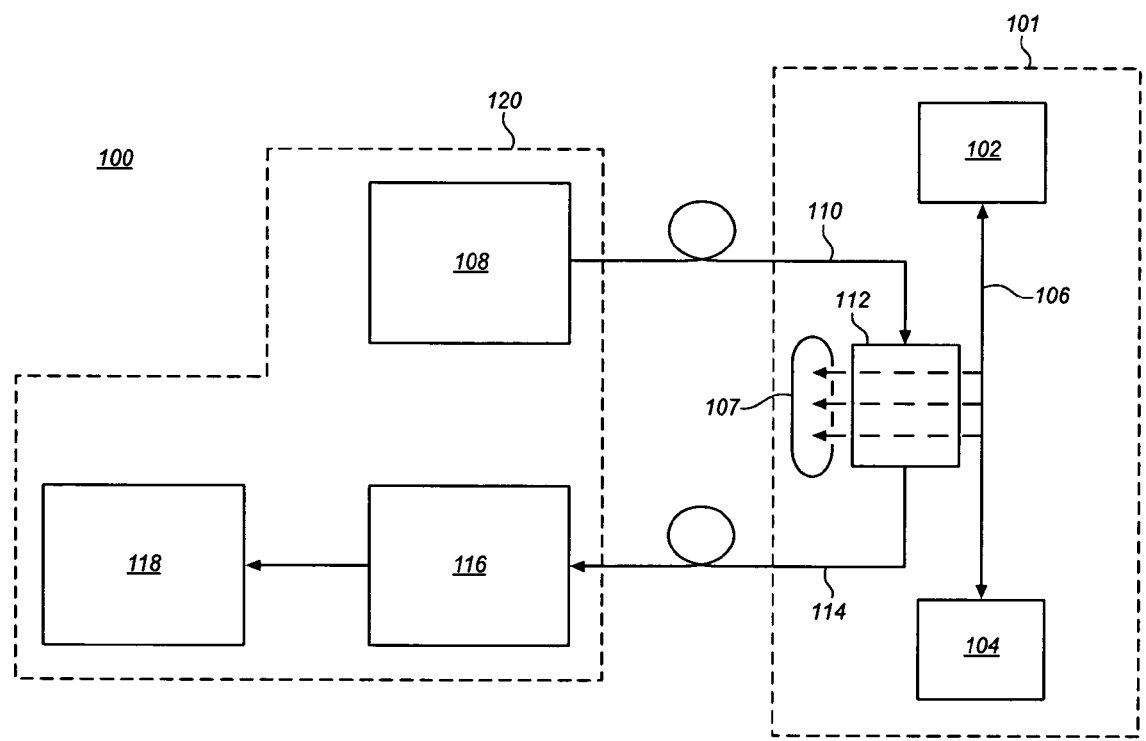
FIG. 1 is a block diagram of a test system to test at least one microelectronic device, according to one or more embodiments of the invention.

FIG. 1 is a block diagram of a test system 100 to test at least one microelectronic device 102, according to one or more embodiments of the invention. The test may be performed to debug, verify, optimize, validate, or otherwise test the microelectronic device.

The test system includes the at least one microelectronic device 102 to be debugged or otherwise tested. In one or more embodiments of the invention, the microelectronic device may include one or more microprocessors, graphics processors or other co-processors, controller chips or other chipset components, or other types of integrated circuits.

The microelectronic device is electrically coupled with a chipset 104 through an electrical signaling medium 106. The microelectronic device and the chipset may exchange electrical signals through the electrical signaling medium. The exchanged electrical signals may be used to test the at least one microelectronic device.

The electrical signaling medium may include one or more traces, wires, lines, interconnects, or other conductors or conductive paths. As will be explained further below, in one or more embodiments of the invention, the electrical signaling medium may include one or more lines or other conductive paths of a motherboard, backplane, or other circuit board with which the microelectronic device and the chipset are electrically coupled, although the scope of the invention is not limited in this respect. For example, in one or more embodiments of the invention, the electrical signaling medium may include a differential pair of interconnects of a serial link on the circuit board to perform binary electrical signaling, although this is not required. Alternatively, the electrical signaling medium may include one or more electrical cables.

As is known, each of the electrical signals conveyed on the electrical signaling medium may generate one or more corresponding fields 107, such as, for example, one or more electromagnetic fields. The fields may represent physical influences that may arise naturally due to flow of electrical current in the electrical signaling medium. An electromagnetic field generally has an electrical field component due to electrical charge and a magnetic field component due to movement of electrical charge due to the electrical current. As will be explained in further detail below, the electrical signals conveyed through the electrical signaling medium may be sensed or probed with an electro-optic modulator (EOM) probe that is influenced by the one or more fields.

The test system includes a light source 108 to provide light. In one or more embodiments of the invention, the light source may include a laser. Examples of suitable lasers include, but are not limited to, semiconductor laser diodes, laser diodes, vertical cavity surface emitting lasers (VCSELs), other miniature lasers, and combinations thereof.

A first optical path 110 has a first end that is optically coupled with the light source to receive the light. As shown, in one or more embodiments of the invention, the first optical path may include an optical fiber, although this is not required. The optical fiber may either be a glass optical fiber or a plastic optical fiber. Other optically transmissive materials and medium are also suitable.

The test system further includes an electro-optic modulator (EOM) probe 112. As shown, in one or more embodiments of the invention, an input of the EOM probe may be optically coupled with a second, opposite end of the first optical path or fiber to receive the light from the light source. Alternatively, the EOM probe may be directly or otherwise optically coupled with the light source to receive the light.

The EOM probe may represent an optical device having a material or component that may modify or modulate a beam of light based, at least in part, on an applied signal, such as, for example, a field generated by an electrical signal conveyed through a signaling medium. The modulation may be imposed on the phase, frequency, amplitude, or direction of the modulated beam. In one or more embodiments of the invention, the material or component may exhibit the electro-optic effect. For example, one or more optical properties of the material or component may change in response to, or as a result of, an applied electric field. The particular optical properties that may change may depend upon the particular material and implementation. Examples of suitable optical properties that may be changed include, but are not limited to, absorption, refractive index, polarization, combinations thereof, and other optical properties entirely. For example, in one or more embodiments of the invention, the material may have a refractive index that depends upon a strength of an applied electrical field. One example of such a material is lithium niobate ($LiNbO_3$), although the scope of the invention certainly is not limited to this particular material. Other inorganic and organic, for example polymer, materials known to exhibit the electro-optic effect, may optionally be used.

As shown, in one or more embodiments of the invention, the EOM probe may be positioned or located at least partially within the electric or electromagnetic field generated by the electrical signals conveyed through the electrical signaling medium. The electromagnetic field may permeate, such as, for example, in three-dimensions, from the electrical signaling medium carrying the current. The strength or intensity of the field may tend to decrease with increasing distance between the EOM probe and the electrical signaling medium. Accordingly, in one or more embodiments of the invention, the EOM probe may be located or positioned in relatively close proximity to the electrical signaling medium. For example, in various embodiments of the invention, at least a portion of the EOM probe may be within a distance of several millimeters of the electrical signaling medium, although the scope of the invention is not limited in this respect. The EOM probe may sense or probe the electrical signals conveyed through the electrical signaling medium through the field, which may change one or more optical properties thereof.

Alternatively, in one or more other embodiments of the invention, the EOM probe may be directly coupled with the electrical signaling medium and in one aspect, some or all of the current of the electrical signals may flow through at least a modulating portion of the EOM probe. This change in the optical properties may modify or modulate the light output from the EOM probe. The EOM probe may tend to have relatively small perturbation of latency, signal integrity, power delivery, system cooling, and the like.

A first optical path 114 has a first end that is optically coupled with the output of the EOM probe to receive the optical signals that are modulated by the electrical signals. As shown, in one or more embodiments of the invention, the second optical path may include an optical fiber, although this is not required. Other optically transmissive materials and medium are also suitable.

The test system further includes a light detector device or other optoelectronic transducer 116. As shown, in one or more embodiments of the invention, the optoelectronic transducer may be optically coupled with a second, opposite end of the second optical path or fiber to receive the communicated modified or modulated light. Alternatively, the EOM probe may be directly or otherwise optically coupled with the light detector.

The light detector or other optoelectronic transducer may sense or detect the modified or modulated light. The optoelectronic transducer may convert the received modulated light or optical signals into corresponding modulated electrical signals. Examples of suitable light detectors or optoelectronic transducers include, but are not limited to, photoresistors, light dependent resistors (LDR), and other devices that change resistance when illuminated, photovoltaic cells, photodiodes, photomultiplier tubes, phototubes, and phototransistors. Examples of suitable photodiodes include, but are not limited to, avalanche photodiodes, p-n photodiodes, p-i-n photodiodes, and combinations thereof. The modulated electrical signals may optionally be amplified and converted to CMOS signals, although the scope of the invention is not limited in this respect.

In one or more embodiments of the invention, one or more optical components, such as, for example, the light source, the optoelectronic transducer, or both, may be capable of faster data rates than the rate of the bus, interconnect, or other electrical signaling medium. For example, in one or more embodiments of the invention, they may be at least two times, or at least four times faster. By way of example, the light source and optoelectronic transducer may be capable of a 40 Gb/s data rate for a 10 Gb/s data rate of the interconnect. However, the scope of the invention is not limited in this respect. This extra speed may allow for long-term use of these optical components.

The test system further includes a logic analyzer module 118. The logic analyzer module may include hardware, software, or a combination of hardware and software to diagnose or otherwise test a digital electronic systems, such as, for example, the at least one microelectronic device, by analyzing the modulated electrical signals. The logic analyzer may analyze the received modulated electrical signals for purposes of debug, validation, optimization, or other testing. For example, the logic analyzer may trigger a sequence of digital events and capture a large amount of digital data from the at least one microelectronic device or system under test. Suitable logic analyzers are commercially available.

As shown, in one or more embodiments of the invention, the light source, the light detector, and the logic analyzer, may optionally be integrated together within a system chassis 120, although this is not required. Alternatively, a subset of these components may optionally be integrated together. As yet another option, at least a subset of these components may be provided together at the same general location. As further shown, in one or more embodiments of the invention, the microelectronic device, the chipset, the electrical signaling medium, and the EOM probe may be provided together at the same general location. This general location is often referred to in the arts as a test bench or station 101.

In one or more embodiments of the invention, the EOM probe may include an optical interferometer. The optical interferometer may be an optical device that is operable to combine two or more beams of light together such that the two or more beams of light may potentially interfere with one another in dependence upon whether or not a field or other control signal is applied and/or a strength of the field or control signal. One particular example of a suitable optical interferometer, according to one or more embodiments of the invention, is a Mach-Zehnder (MZ) interferometer.

Figure 2A:
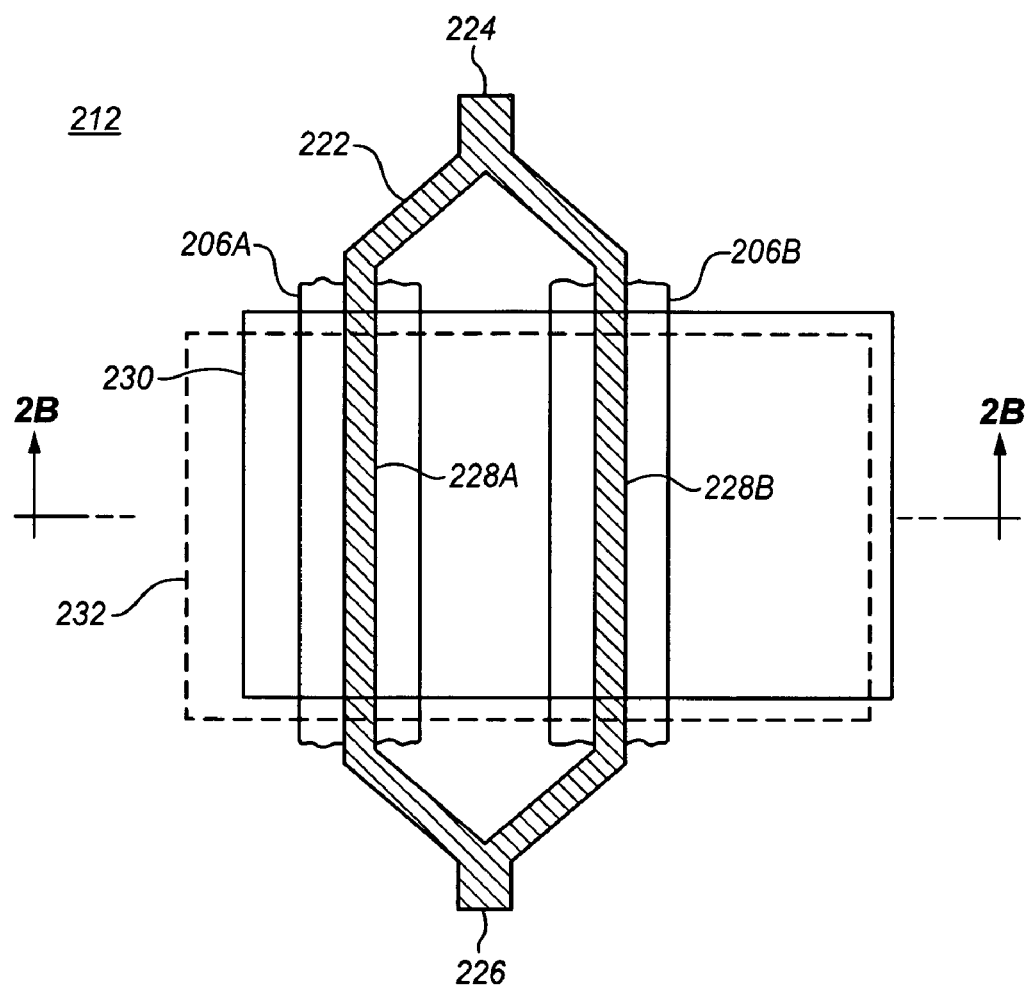
FIGS. 2A-B illustrate an electro-optic modulator (EOM) probe, according to one or more embodiments of the invention.
Figure 2B:
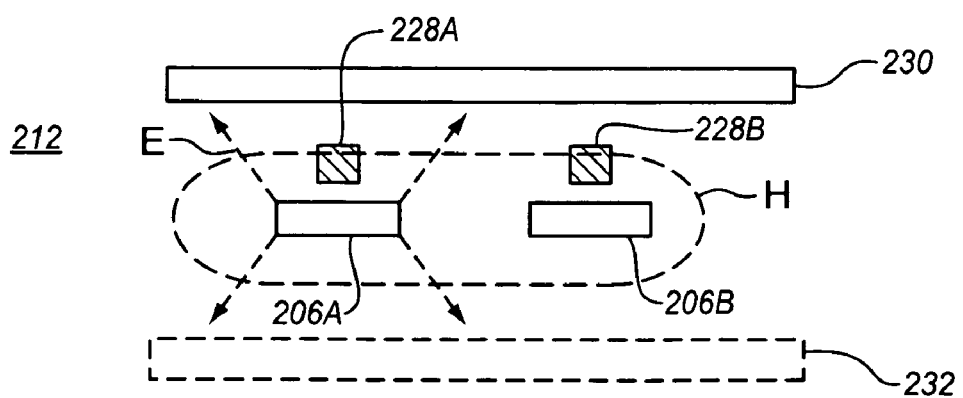

FIGS. 2A-B illustrate an EOM probe 212 to sense electrical signals conveyed through an electrical signaling medium 206A-B, according to one or more embodiments of the invention. In particular, FIG. 2A is a top planar view of the EOM probe, and FIG. 2B is a cross-sectional view of the EOM probe taken along section line 2B.

The EOM probe includes a Mach-Zehnder (MZ) interferometer 222. The MZ interferometer includes a light input end or portion 224, a light output end or portion 226, and two or more central branches or optical paths 228A-B between the input and the output. In particular, the illustrated MZ interferometer includes a left optical path 228A and a right optical path 228B, although three or more optical paths may optionally be used. It should be noted that terms such as "right", "left", "top", "bottom", "upper", "lower", "vertical", "horizontal", and the like, are used herein only to facilitate the description of the device illustrated. It will be evident that the devices may be used in a variety of orientations, including, but not limited to, inverted and tilted orientations.

In one or more embodiments of the invention, the MZ interferometer may include planar waveguides fabricated in a substrate, such as, for example, an optical integrated circuit. Alternatively, in one or more embodiments of the invention, the MZ interferometer may include optical fibers, beam splitters, and beam combiners. These are just a few illustrative examples, and the scope of the invention is not limited to just these particular examples.

At least a portion of the MZ interferometer is located or positioned within one or more of an electric field (E) and a magnetic field (H) generated by electrical current flowing through an electrical signaling medium 206A-B. In the illustrated embodiment, the electrical signaling medium includes a left line 206A and a right line 206B of a differential pair of lines, although the scope of the invention is not limited to this particular electrical signaling medium. For example, an alternate embodiment is contemplated in which one branch of the interferometer is above a single line and the other branch is not. The lines are broken to facilitate illustration. By way of example, one of the lines may carry sig and another of the lines may carry sig# (a complimentary signal). As shown, in one or more embodiments of the invention, the left optical path may overly the left line, and the right optical path may overly the right line. Alternatively, the optical paths may underlie the lines.

In one or more embodiments of the invention, the optical paths and the lines may be proximate one another. For example, the optical paths and lines may be close enough for the field generated by the electrical current in the lines to modify the optical properties of the interferometer. By way of example, in various embodiments of the invention, a vertical closest distance of separation of the optical paths from the corresponding lines may be less than one centimeter, or less than five millimeters, although the scope of the invention is not limited in this respect.

The input of the MZ interferometer may be optically coupled or configured to receive a beam of light. For example, an optical fiber carrying a beam of light from a laser may be optically coupled with the input. The beam of light may be split into two or more beams each corresponding to respective ones of the two or more branches or optical paths.

At least one or both of the branches or optical paths may have a material exhibiting the electro-optic effect in which one or more optical properties of the material may change in response to, or as a result of, an applied electric field. For example, one or more of the branches or optical paths may have a material, such as, for example, lithium niobate or other materials known in the art, which has a refractive index that depends on a strength of an applied electric field. The branch or path having the material may represent a phase optical modulation path. In one or more embodiments of the invention, the optical modulation path may have a length of at least one or two centimeters, although this is not required.

Light may travel at a different speed in the material when the material is exposed to an electric field, than when the material is exposed to a different strength of electric field, or is not exposed to an electric field. Without wishing to be bound by theory, the phase of the light leaving an branch or optical path may be based on the time it took the light to traverse the length of the branch, which time may be based on the speed of light.

Modifying or modulating the electric field on one or a subset of the branches or optical paths may accordingly be used to cause, or at least result in, constructive or destructive interference of the two or more beams when they are combined at the output. This constructive or destructive interference may modify or modulate the amplitude or intensity of the exiting light. Accordingly, in one or more embodiments, the EOM may include an optical device in which light may interfere between two or more branches or optical paths that are modulated to vary their relative phase using electrical fields generated by the electrical currents in the lines of the differential pair. The resulting modulated optical signals may tend to be strong. This may help to promote a good bit error rate (BER). This may also permit direct interfacing to CMOS. However, the scope of the invention is not limited in these respects.

As shown, the lines and MZ interferometer may optionally be sandwiched or disposed between an optional top ground plane 230, and an optional bottom ground plane 232. These ground planes may be similar to the conventional ground planes of printed circuit boards.

Figure 3A:
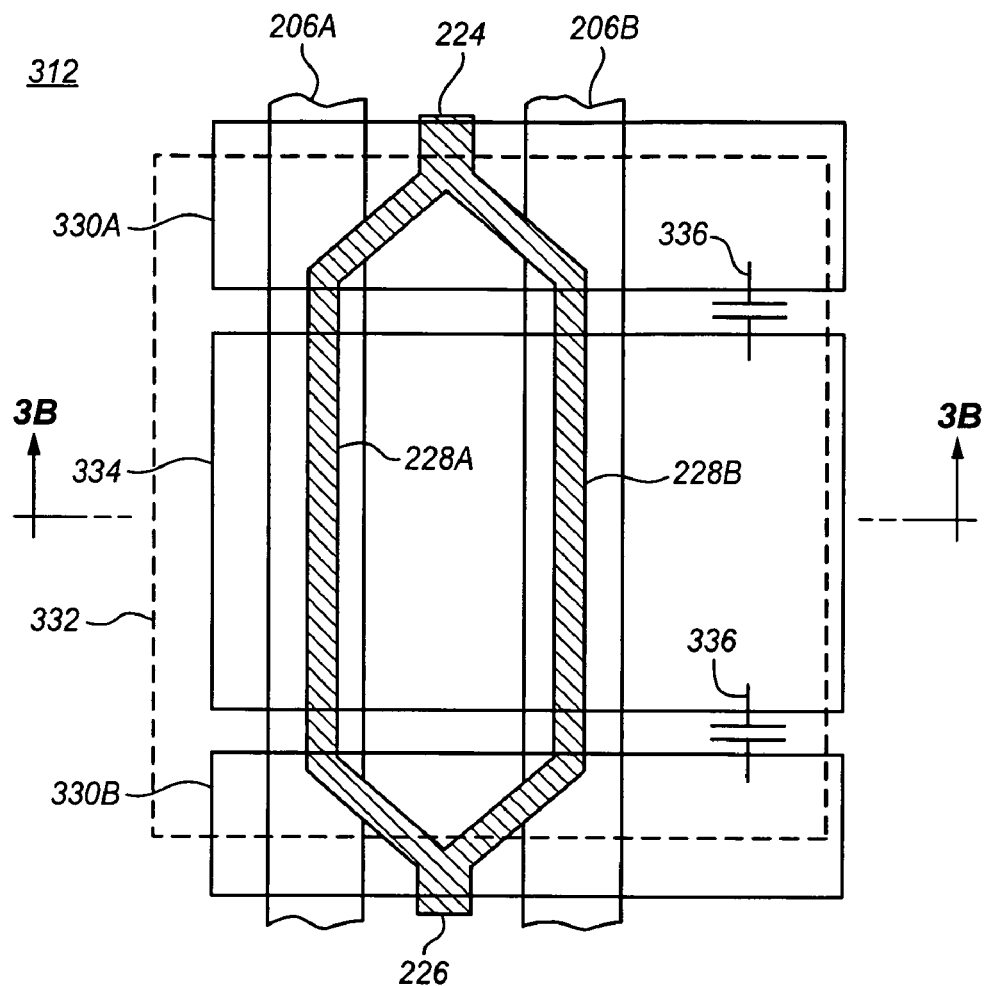
FIGS. 3A-B illustrate an electro-optic modulator (EOM) probe having a positive plane to provide a bias field, according to one or more embodiments of the invention.
Figure 3B:
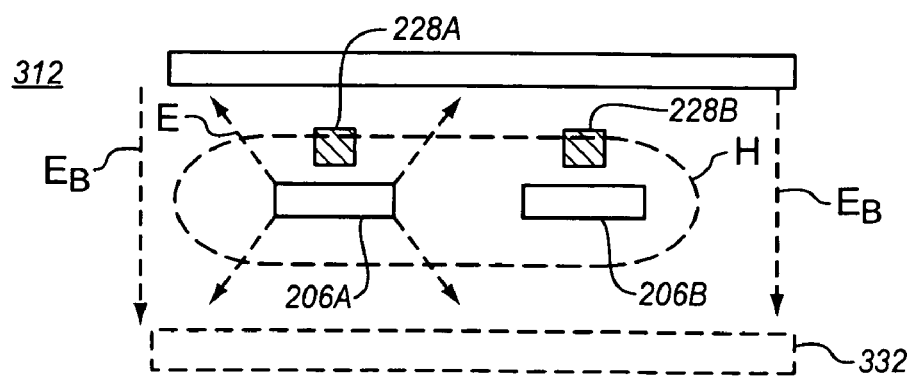

In one or more embodiments of the invention, a bias field may optionally be applied to the MZ interferometer or other EOM probe. FIGS. 3A-B are corresponding top planar and cross-sectional views of an alternate EOM probe 312 to sense electrical signals conveyed in an electrical signaling medium 206A-B and having a positive plane 334 to provide a bias electric field ($E_B$), according to one or more embodiments of the invention.

The top and bottom planes have been changed relative to the previously described EOM probe. In particular, the top ground plane of the previously described EOM probe has been replaced by a central, top positive plane 334 disposed horizontally between a first top ground plane 330A and a second top ground plane 330B. The central, top positive plane overlies a central or middle portion of the MZ interferometer having the two or more branches or optical paths. The first top ground plane overlies the input of the MZ interferometer. The second top ground plane overlies the output. Alternate embodiments are contemplated in which the positive plane instead underlies the MZ interferometer. The bottom ground plane 332 is optionally somewhat lengthened, although this is not required.

The central, top positive plane may be coupled with and have a positive potential during operation. The positive potential may generate a substantially constant bias direct current (DC) electric field ($E_B$) in the underlying central portion of the MZ interferometer. This bias electric field may help to adjust the total electric field in the material exhibiting the electro-optic effect to a more effective, or at least higher or different level. However, this bias field is optional and not required.

Due to the differential nature of the signaling, in the illustrated embodiment, the differential return currents may be roughly matched. In one or more embodiments of the invention, one or more alternating current decoupling capacitors 336 may optionally be included electrically coupled between the central, top positive plane and one or more of the first and second top ground planes. However, these capacitors are optional and not required.

Aside from the biasing aspect of the illustrated EOM probe, other features may optionally be similar to, or the same as, those described above in conjunction with FIGS. 2A-B. The same reference numerals have been used to designate components that may optionally be the same. For brevity, and to avoid obscuring the description, these features will not be repeated. The last two digits of the reference numerals have been repeated to designate components that are analogous or corresponding, and which may optionally have certain features in common with those previously described.

Now, the scope of the invention is not limited to MZ interferometers. Other EOMs known in the arts may optionally be used. For example, in one or more embodiments of the invention, an electroabsorption modulator may be used. As another example, in one or more embodiments of the invention, a Kerr cell may be used. As yet another example, in one or more embodiments of the invention, a Pockels cell may be used.

The EOM probes disclosed herein may be deployed or included in various different locations relative to the electrical signaling medium over which signals are conveyed to and/or from the microelectronic device under test. For example, in one or more embodiments of the invention, an EOM probe may be included on, over, under, adjacent to, within, as part of, or otherwise proximate to, an electrical signaling medium on or of a motherboard, backplane, or main circuit board. As another example, in one or more embodiments of the invention, an EOM probe may be included on, over, under, adjacent to, within, as part of, or otherwise proximate to, an electrical signaling medium on or of a daughterboard or small circuit board. As yet another example, which will be discussed further below, in one or more embodiments of the invention, an EOM probe may be included on, over, under, adjacent to, within, as part of, or otherwise proximate to, an electrical signaling medium on or of a connector connecting a daughterboard or small circuit board to a motherboard, backplane, or main circuit board. As a still further example, which will be discussed further below, in one or more embodiments of the invention, an EOM probe may be included on, over, under, adjacent to, within, as part of, or otherwise proximate to, an electrical signaling medium on or of an interposer connecting a daughterboard or small circuit board to a motherboard, backplane, or main circuit board. Alternatively, the EOM probe may optionally be included on, over, under, adjacent to, within, as part of, or otherwise proximate to, another portion of the electrical signaling medium on the path over which the electrical signals to and/or from the microelectronic device under test are conveyed.

Figure 4:
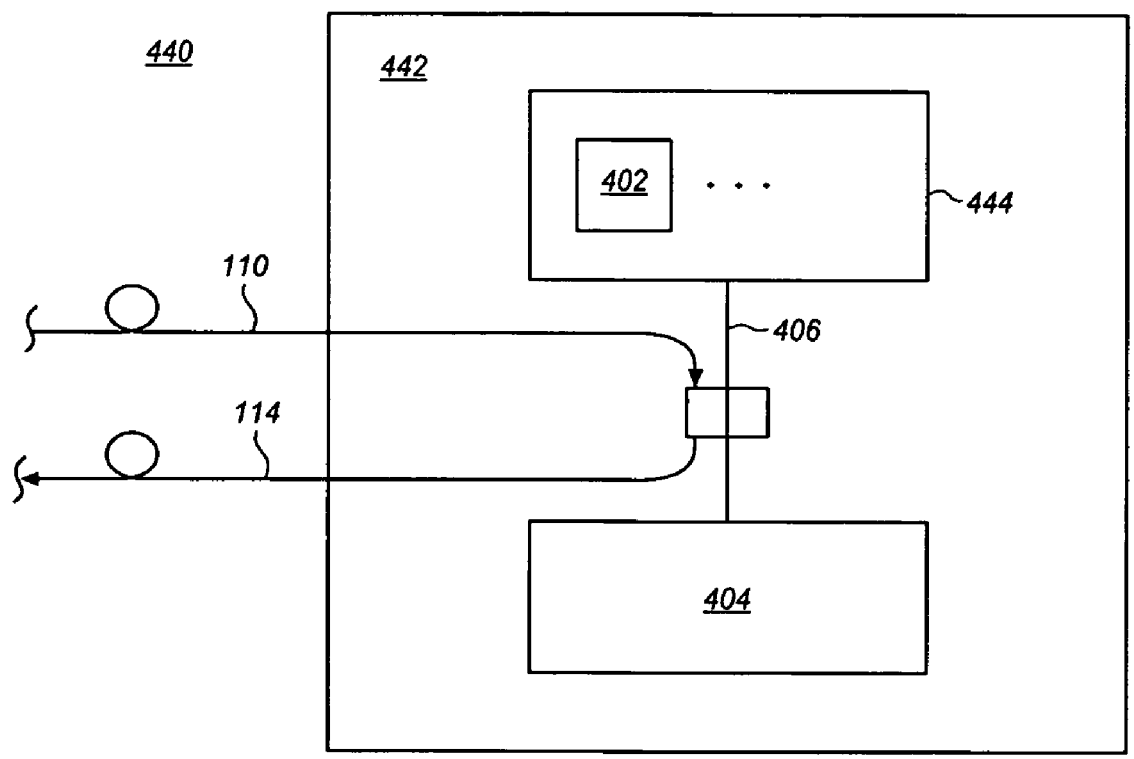
FIG. 4 is a block diagram showing an electro-optic modulator (EOM) probe proximate an electrical signaling medium on or of a main circuit board, according to one or more embodiments of the invention.

First, let's further discuss a situation in which the EOM probe is included proximate to the electrical signaling medium on or of the motherboard or main circuit board. FIG. 4 is a block diagram showing a portion of a test system 440 in which an EOM probe 412 is included proximate an electrical signaling medium 406 on or of a motherboard or other main circuit board 442, according to one or more embodiments of the invention. The illustrated portion of the test system may be located at a test bench.

At least one microelectronic device 402 to be tested may be electrically coupled with a motherboard or other main circuit board 442. As shown, in one or more embodiments of the invention, the at least one microelectronic device may be electrically coupled with a daughterboard or other smaller circuit board 444, which may in turn be electrically coupled with the main circuit board. Alternatively, in one or more embodiments, the at least one microelectronic device may be directly coupled with the main circuit board.

The main circuit board has a bus, interconnect, serial link, or other electrical signaling medium 406 disposed thereon, such as, for example, as a plurality of metal traces. A chipset 404 is also electrically coupled with the main circuit board and operable to exchange electrical signals with the microelectronic device using the electrical signaling medium.

An EOM probe 412 may be electrically coupled with the bus, interconnect, or other electrical signaling medium, such as, for example, through one or more fields generated by electrical signals conveyed through the medium. In one or more embodiments of the invention, at least a portion of the EOM probe may be located or positioned over the electrical signaling medium. Alternatively, in one or more embodiments of the invention, at least a portion of the EOM probe may be located or positioned under the electrical signaling medium. For example, one branch or optical path of an MZ interferometer or other optical interferometer may be located under or over a first line of a differential pair and another branch or optical path of the optical interferometer may be located under or over a second line of a differential pair, although the scope of the invention is not limited in this respect. As yet another option, in one or more embodiments of the invention, at least a portion of the EOM probe may be located or positioned adjacent to or otherwise proximate to or within a half a centimeter of a portion of the electrical signaling medium.

As a still further option, at least some or all of the current of the electrical signals may flow through at least a portion of the EOM probe. That is, at least a portion of the EOM probe may form a part of the electrical signaling medium. In one aspect, the metal lines may break and an electro-optic material of the EOM probe may form a conductive bridge across the break. However, this is not required.

An end portion of a first optical fiber or path 110 may be optically coupled with an input of the EOM probe to provide light to the EOM probe. An end portion of a second optical fiber or path 114 may be optically coupled with an output of the EOM probe to transmit or otherwise provide light that is modulated by the electrical signals in the electrical signaling medium away from the EOM probe, such as, for example, to a light detector or other optoelectronic transducer located at another end of the optical fiber.

Now, let's discuss situations in which the EOM probe is included proximate to a connector or interposer connecting a daughterboard or small circuit board to a motherboard, backplane, or main circuit board.

Figure 5:
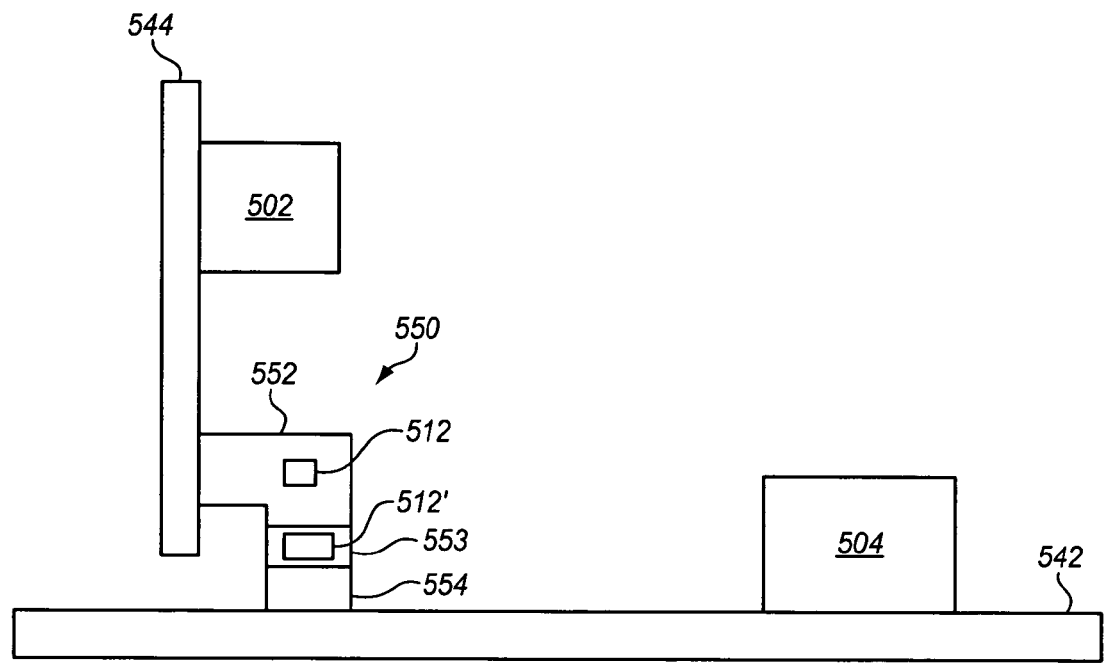
FIG. 5 is a block diagram of a cross-sectional view of a small circuit board electrically coupled with a main circuit board through a connector having one or more electro-optic modulator (EOM) probes, according to one or more embodiments of the invention.

FIG. 5 is a block diagram of a cross-sectional view of a daughterboard or small circuit board 544 electrically coupled with a motherboard, backplane, or main circuit board 542 through a connector 550 having one or more EOM probes 512, 512', according to one or more embodiments of the invention.

A microelectronic device 502 to be tested is electrically coupled with the small circuit board. By way of example, the microelectronic device may include one or more integrated circuits or one or more packaged integrated circuits.

The small circuit board is electrically coupled with the main circuit board through the connector 550. The connector may represent an extension of, and a portion of, the electrical signaling medium used to communicate or exchange signals with the microelectronic device under test. Examples of suitable connectors include, but are not limited to, the commercially available AirMax VS(R) Connector System, which is commercially available from FCI Americas, of Etters, Pa., the VHDM connectors, which are commercially available from Teradyne, of Boston, Mass., and similar connectors known in the arts.

In one or more embodiments of the invention, the connector may have two or more separable pieces or portions, although this is not required. A first vertical receptacle piece or portion 554 may interface with or be connected to the main circuit board. A second header piece or portion 552 may interface with or be connected to the first vertical receptacle piece or portion and may interface with or be connected to the smaller circuit board. Alternatively, the connector may have fewer or more pieces or portions.

A chipset 504 is electrically connected to or coupled with the main circuit board. The chipset may exchange electrical signals with the microelectronic device under test through electrical signaling mediums of the main circuit board, the connector, and the small circuit board in conjunction with debugging, validation, or other testing.

As shown, in one or more embodiments of the invention, the connector 550 may have one or more EOM probes 512, 512'. In particular, in one or more embodiments of the invention, a header piece or portion 552, or other portion of the connector that interfaces or connects with the small circuit board, may have one or more EOM probes 512. In one or more embodiments of the invention, an interposer piece 553 having one or more EOM probes 512', may optionally be disposed between and electrically coupled between the first vertical receptacle piece or portion 554 and the second header piece or portion 552, although this is not required.

Figure 6:
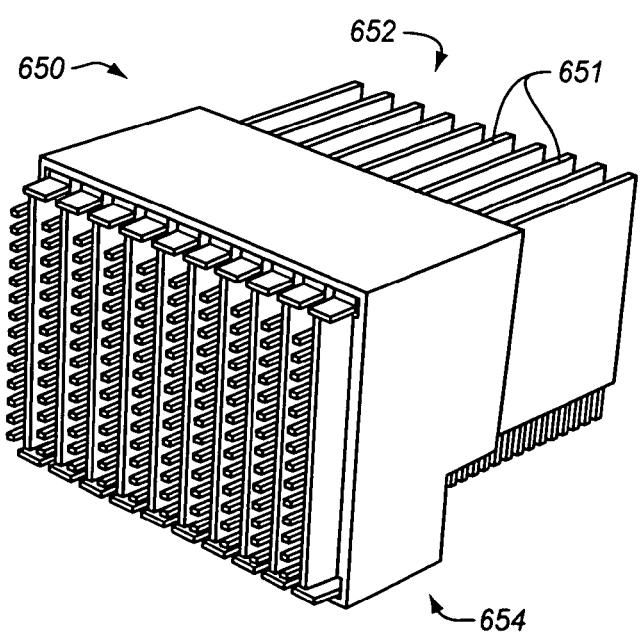
FIG. 6 is a perspective view of an example connector that is suitable for implementing one or more embodiments of the invention.

FIG. 6 is a perspective view of an example connector 650 that is suitable for implementing one or more embodiments of the invention. This particular connector has certain similarities to the commercially available AirMax VS(R) Connector System. The connector includes a first vertical receptacle piece or portion 654, and a second header piece or portion 652. As shown, the header piece or portion itself has a number of separately detachable circuit boards 651 that project like fins from the connector. However, the scope of the invention is not limited to this particular connector.

Figure 7A:
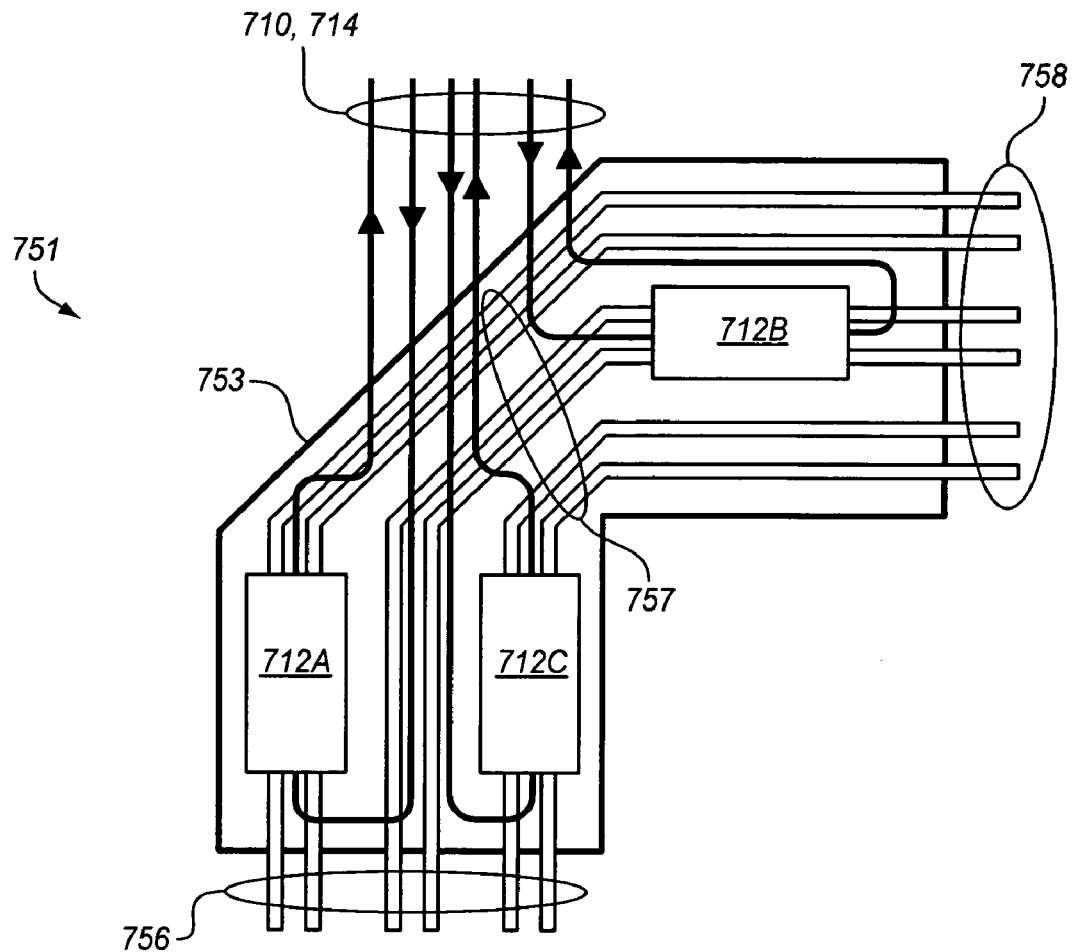
FIG. 7A-B illustrate a plurality of electro-optic modulator (EOM) probes coupled with a detachable circuit board that may be used in a connector, according to one or more embodiments of the invention.
Figure 7B:
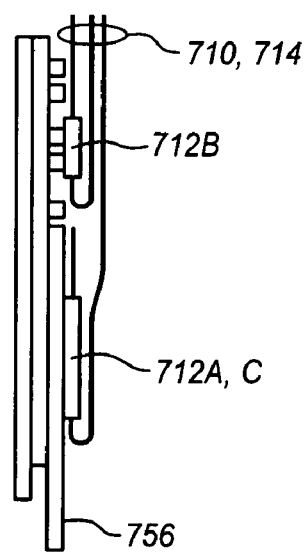

FIG. 7A-B illustrate a plurality of EOM probes 712A-C coupled with a detachable circuit board 751 that may be used in a connector 550, 650, according to one or more embodiments of the invention. FIG. 7A is a top planar view. FIG. 7B is a left hand side view of the illustrated top planar view.

The circuit board includes a housing 753, lines or traces 757, a first set of main circuit board-side connectors 756, and a second set of small circuit board-side connectors 758. The main circuit board-side connectors may be connected with another portion of the connector. The small-circuit board-side connectors may be connected with the small circuit board. Corresponding connectors on the main and small circuit board sides are electrically coupled together through the intervening lines or traces. Three sets of differential pairs each are included in the lines or traces of the illustrated embodiment, although the scope of the invention is not so limited. Fewer or more sets of differential pairs may also optionally be used.

As shown in the illustrated embodiment, one or more EOM probes may be included on, over, under, adjacent to, or otherwise proximate to, an electrical signaling medium on or of the circuit board. In the illustrated embodiment, three EOM probes 712A-C are respectively included on or over respective ones of the three sets of differential pairs, although the scope of the invention is not so limited. In one or more embodiments of the invention, each of the EOM probes may include an optical interferometer, such as, for example, similar to the MZ interferometers illustrated in either FIGS. 2A-B or 3A-B, although this is not required. Optical fibers or other optical paths 710, 714 may carry light to and from each of the EOM probes.

In one or more embodiments of the invention, each of the EOM probes may have an optical modulation path length that may be less than about one centimeter, such as, for example, from about 0.25 to about 0.5 centimeters, although the scope of the invention is not limited in this respect. In one or more embodiments of the invention, an EOM probe may optionally be folded, bent, or designed or made folded or bent or turned back on itself. This may help to increase a length or dimension of an optical modulation path without significantly increasing overall EOM probe length, dimension, or footprint. However, this is optional and not required.

In one or more embodiments of the invention, the EOM probes may be manufactured as part of the integrated circuit during the manufacturing or assembly process. Alternatively, in one or more embodiments of the invention, the EOM probes may be attached to or coupled with commercially obtained circuit boards. In some cases, the lines or traces may be exposed, in which case the EOM probes may be placed relative to the lines or traces. In other cases, a housing may cover the lines or traces, in which case the housing may optionally be opened to expose the lines or traces, then the EOM probes may be placed relative to the lines or traces, and then the housing may optionally be closed, although this is not required.

Figure 8:
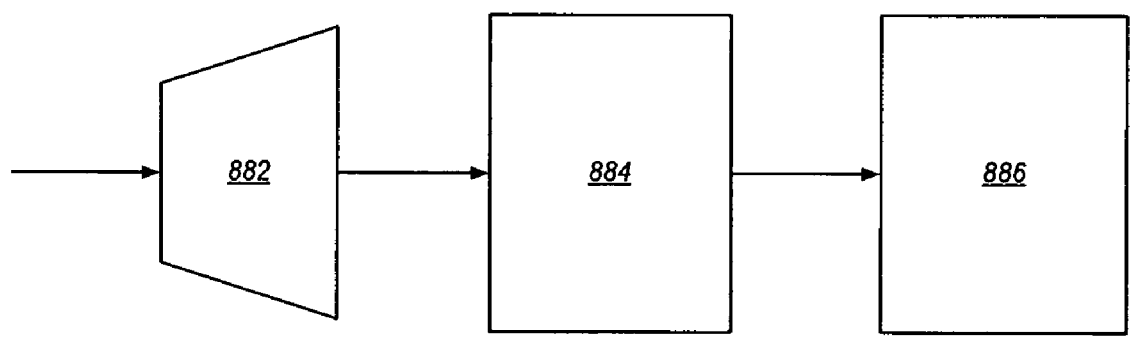
FIG. 8 is a block diagram of a programmable logic analyzer module, according to one or more embodiments of the invention.

FIG. 8 is a block diagram of a programmable logic analyzer module 818, according to one or more embodiments of the invention. The programmable logic analyzer module includes a demultiplexer (demux) 882, a field programmable gate array (FPGA) 884, and additional logic analyzer logic or storage 886.

The demux may receive the modulated electrical signals output from the light detector or other optoelectronic transducer. In one or more embodiments of the invention, the modulated electrical signals may be at high speed, such as, for example, at 5 Gb/s or higher, although the scope of the invention is not limited in this respect. The demux may demultiplex the modulated electrical signals, and generally slow the demultiplexed signals down. By way of example, in one or more embodiments of the invention, the signals may be slowed down by a factor ranging from 2 to 16 times.

The FPGA is electrically coupled with an output of the demux by an interconnect or electrical signaling medium and may receive the electrical signals. In one or more embodiments of the invention, this interconnect or signaling medium may be slower and wider than the interconnect or signaling medium or used to provide the modulated electrical signals to the demux. In one or more embodiments of the invention, the FPGA may operate at a rate of about several hundred gigahertz.

The FPGA may provide typical logic analyzer functions, such as, for example, capturing, tracing, triggering, storing, pattern matching, and providing system interrupts. In one or more embodiments of the invention, the FPGA may optionally be programmable and may optionally be reprogrammed. By way of example, the FPGA may be reprogrammed to adapt to specification edits, improvements, and quick workarounds. As another example, in one or more embodiments of the invention, the FPGA may be reprogrammed with different FPGA codes to support multiple different types of electrical links, such as, for example, PCI Express, Universal Serial Bus (USB), FBD, CSI, and the like. As yet another example, different data rates may optionally be supported. However, the use of an FPGA is not required. In alternate embodiments, the FPGA may be replaced with other logic, such as, for example, an application specific integrated circuit (ASP), or a general-purpose processor executing software instructions.

In one or more embodiments of the invention, one or more of the demux and the FPGA may optionally be standard, off-the-shelf components. Suitable components are available, for example, from the optical/telecom industry. The use of off-the-shelf components may help to reduce development times and costs compared to developing custom components, but is optional and not required.

Figure 9:
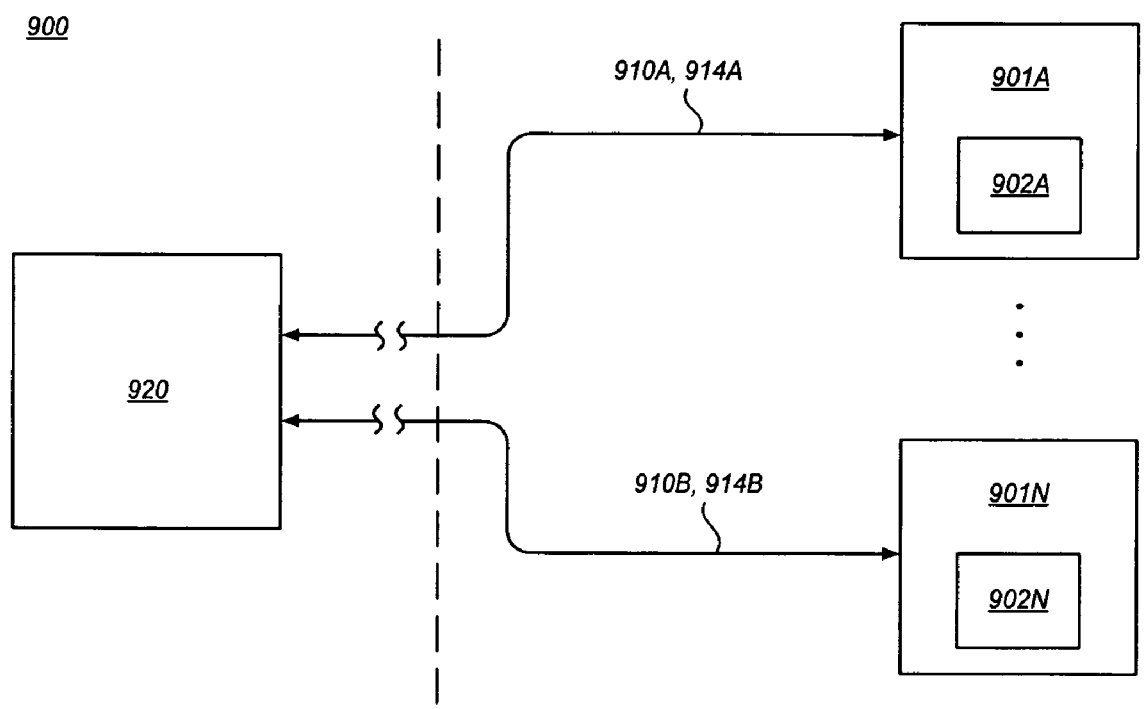
FIG. 9 is a block diagram of a test system having a plurality of test stations that are each separately optically coupled with a shared optical and logic analysis resource, according to one or more embodiments of the invention.

FIG. 9 is a block diagram of a test system 900 having a plurality of test benches or stations 901A-N that are each separately optically coupled with a shared optical and logic analysis resource 920, according to one or more embodiments of the invention. In particular, a first test bench or station 901A and a second test bench or station 901N are optically coupled with the shared optical and logic analysis resource by one or more first optical fibers or paths 910A, 914A and one or more second optical fibers or paths 910B, 914B, respectively.

The first test bench or station has at least a first microelectronic device 902A to be tested, and the second test bench or station has at least a second microelectronic device 902N to be tested. The first and second test benches or stations may optionally be mutually remote or physically separated from one another, such as, for example, by at least five, ten, or twenty meters, to name just a few examples.

The optical fibers or other optical paths disclosed herein may convey the optical signals over relatively large distances with little loss or distortion. By way of example, in one or more embodiments of the invention, the optical fibers or paths may be at least five meters, ten meters, or twenty meters, although the scope of the invention is not so limited. In contrast, electrical signals conveyed through copper cables generally allow for much more limited travel distances. Copper cables used to test microprocessors are generally shorter than about three meters. Alternatively, the optical paths may optionally be short or on the order of the same size as copper cables.

In one or more embodiments of the invention, due at least in part to this ability to convey the optical signals over large distances, a portion of the overall testing system, such as, for example, the shared optical and logic analysis resource or sub-system, may be located remotely from one or more or all of the test stations and associated microelectronic devices. For example, in various embodiments of the invention, the separation distance from at least one of the testing stations may be at least three, five, ten, or twenty meters, to name just a few examples.

Furthermore, the resource may be shared among the test stations. By way of example, in one or more embodiments of the invention, the shared optical and logic analysis resource may have one or more light sources to provide light to the testing stations, one or more light detectors or optoelectronic transducers to detect modulated light received from the testing stations or derive modulated electrical signals from the modulated optical signals, and one or more logic analyzer modules to analyze modulated electrical signals, although this is not required. As another option, one or more light sources may optionally be located at one or more test stations or elsewhere.

Such sharing of a common resource may help to reduce capital equipment costs. For example, rather than having a logic analyzer and associated interface for each test bench, a plurality of test benches may share a single logic analyzer. Additionally, using a common shared resource may help to reduce the total amount of cabling and setup time used in the testing. The optical cables may also tend to be smaller and/or more flexible than their counterpart copper cables.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

It will also be appreciated, by one skilled in the art, that modifications may be made to the embodiments disclosed herein, such as, for example, to the sizes, shapes, configurations, forms, functions, materials, and manner of operation, and assembly and use, of the components of the embodiments. All equivalent relationships to those illustrated in the drawings and described in the specification are encompassed within embodiments of the invention.

For simplicity and clarity of illustration, elements illustrated in the figures have not necessarily been drawn to scale. For example, the dimensions of some of the elements are exaggerated relative to other elements for clarity. Further, where considered appropriate, reference numerals or terminal portions of reference numerals have been repeated among the figures to indicate corresponding or analogous elements, which may optionally have similar characteristics.

Various operations and methods have been described. Some of the methods have been described in a basic form, but operations may optionally be added to and/or removed from the methods. The operations of the methods may also often optionally be performed in different order. Many modifications and adaptations may be made to the methods and are contemplated.

Certain operations may be performed by hardware components, or may be embodied in machine-executable instructions, that may be used to cause, or at least result in, a circuit programmed with the instructions performing the operations. The circuit may include a general-purpose or special-purpose processor, or logic circuit, to name just a few examples. The operations may also optionally be performed by a combination of hardware and software.

For clarity, in the claims, any element that does not explicitly state "means for"performing a specified function, or "step for" performing a specified function, is not to be interpreted as a "means" or "step" clause as specified in 35 U.S.C. Section 112, Paragraph 6. In particular, any potential use of "step of" in the claims herein is not intended to invoke the provisions of 35 U.S.C. Section 112, Paragraph 6.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

Accordingly, while the invention has been thoroughly described in terms of several embodiments, those skilled in the art will recognize that the invention is not limited to the particular embodiments described, but may be practiced with modification and alteration within the spirit and scope of the appended claims. The description is thus to be regarded as illustrative instead of limiting.

What is claimed is:

1. An apparatus comprising:
an electrical connector to be electrically disposed between a first circuit board and a second circuit board to electrically couple the first circuit board with the second circuit board, wherein the electrical connector comprises a third circuit board, and wherein the third circuit board comprises a first plurality of second circuit board-side connectors to connect with the second circuit board, the second circuit board comprising a daughter board; and
an electro-optic modulator (EOM) to modulate optical signals based on electrical signals exchanged between the first and second circuit boards through the electrical connector.

2. The apparatus of claim 1, wherein the third circuit board comprises a second plurality of first circuit board-side connectors to connect with an electrical connector electrically disposed between the third circuit board and the first circuit board, the first circuit board comprising a backplane.

3. The apparatus of claim 2, wherein the daughter board is perpendicular relative to the backplane, and wherein the first plurality of connectors are perpendicular relative to the second plurality of connectors.

4. The apparatus of claim 1, wherein the third circuit board has exposed lines, and wherein the EOM is placed within several millimeters of the exposed lines.

5. The apparatus of claim 1, wherein the EOM comprises an optical interferometer.

6. The apparatus of claim 5, wherein the optical interferometer comprises a Mach-Zehnder interferometer.

7. The apparatus of claim 1, wherein the EOM comprises a material having an optical property that depends upon strength of an applied electrical signal.

8. The apparatus of claim 1 wherein the EOM is folded.

9. The apparatus of claim 1, further comprising the second circuit board.

10. The apparatus of claim 1, further comprising a plane having a positive potential to provide a bias direct current field to the EOM 11. An apparatus comprising:
an electrical connector to be electrically disposed between a first circuit board and a second circuit board to electrically couple the first circuit board with the second circuit board; and
an electro-optic modulator (EOM) to modulate optical signals based on electrical signals exchanged between the first and second circuit boards through the electrical connector,
wherein the electrical connector comprises a third circuit board, wherein the third circuit board has exposed lines, wherein the EQM is placed within several millimeters of the exposed lines, wherein the exposed lines comprise an exposed differential pair of lines, and wherein a first optical branch of the EOM is adjacent to a first line of the differential pair and a second optical branch of the EOM is adjacent to a second line of the pair.

12. An apparatus comprising:
an electrical connector to be electrically disposed between a first circuit board and a second circuit board to electrically couple the first circuit board with the second circuit board, wherein the electrical connector comprises an interposer to be electrically disposed between a first circuit board-side connector operable to be connected to the first circuit board and a second circuit board-side connector operable to be connected to the second circuit board; and
an electro-optic modulator (EOM) to modulate optical signals based on electrical signals exchanged between the first and second circuit boards through the electrical connector.

13. The apparatus of claim 12, wherein the electrical connector comprises a third circuit board.

14. An apparatus comprising:
a first circuit board and a second circuit board;
a microelectronic device electrically coupled with the second circuit board;
an electrical connector to be electrically disposed between the first circuit board and the second circuit board to electrically couple the first circuit board with the second circuit board;
an electro-optic modulator (EOM) to modulate optical signals based on electrical signals exchanged between the first and second circuit boards through the electrical connector;
an optical fiber optically coupled with the EOM to convey the modulated optical signals;
an optoelectronic transducer to convert the modulated optical signals to modulated electrical signals; and
a logic analyzer module to debug the microelectronic device based on the modulated electrical signals.

15. The apparatus of claim 14, wherein the optical fiber has a length of at least five meters.

16. The apparatus of claim 14, wherein the logic analyzer module is communicatively coupled with a plurality of mutually remote test benches to analyze modulated electrical signals received from each of the mutually remote test benches.

17. The apparatus of claim 14, wherein the logic analyzer module comprises:
a demultiplexer to convert the modulated electrical signals to a second format that has a smaller bit rate and a larger bit width than a format of the modulated electrical signals; and
a field programmable gate array (FPGA) to process the electrical signals in the second format.

18. A system comprising:
a first circuit board;
a second circuit board;
a microelectronic device electrically coupled with the second circuit board;
an electrical connector to be disposed between and electrically couple the first circuit board with the second circuit board;
an electro-optic modulator (EOM) to modulate optical signals based on electrical signals that are communicated between the first and second circuit boards through the electrical connector;
a glass optical fiber optically coupled with the EUM to convey the modulated optical signals;
an optoelectronic transducer coupled with the glass optical fiber to receive and convert the modulated optical signals to modulated electrical signals; and
a logic analyzer module to debug the microelectronic device based on the modulated electrical signals.

19. The system of claim 18, wherein the electrical connector comprises a circuit board, and wherein the EOM comprises an optical interferometer.

20. A method comprising:
disposing an electrical connector having an electro-optic modulator (FOM) between a first circuit board and a second circuit board to electrically couple the first and second circuit boards, wherein said disposing comprises plugging pins of the electrical connector into the second circuit board, the second circuit board comprising a daughter board; and
modulating optical signals based on electrical signals exchanged between the first and second circuit boards through the electrical connector using the EOM.

21. The method of claim 20, further comprising debugging a microelectronic device based, at least in part, on the modulated optical signals.

22. The method of claim 20, further comprising:
folding the EOM; and
coupling the folded EOM with the electrical connector.

23. A system comprising:
a plurality of testing stations that are separated from one another, each of the testing stations having:
a first circuit board and a second circuit board;
a microelectronic device electrically coupled with the second circuit board;
an electrical connector to be electrically disposed between the first circuit board and the second circuit board to electrically couple the first circuit board with the second circuit board;
an electro-optic modulator (EOM) to modulate optical signals based on electrical signals exchanged between the first and second circuit boards through the electrical connector;
a plurality of optical fibers that are each optically coupled with one of the EOMs to convey the modulated optical signals;
at least one optoelectronic transducer to convert the modulated optical signals to modulated electrical signals; and
a shared logic analyzer module to debug each of the microelectronic devices based on the modulated electrical signals.

* * * * *

UNITED STATES PATENT AND TRADEMARK OFFICE
CERTIFICATE OF CORRECTION

PATENT NO. : 7,525,723 B2
APPLICATION NO. : 11/479889
DATED : April 28, 2009
INVENTOR(S) : Dabral et al.

It is certified that error appears in the above-identified patent and that said Letters Patent is hereby corrected as shown below:

In column 14, at line 21, delete "EQM" and insert -- EOM --.

In column 15, at line 21, delete "EUM" and insert -- EOM --.

In column 15, at line 33, delete "(FOM)" and insert -- (EOM) --.

Signed and Sealed this

Thirteenth Day of April, 2010

David J. Kappos
*Director of the United States Patent and Trademark Office*